United States Patent [19]

Nakano et al.

[11] Patent Number: 4,821,138
[45] Date of Patent: Apr. 11, 1989

[54] MONITORING DEVICE FOR OVERHEAD POWER TRANSMISSION SYSTEM

[75] Inventors: Tsuneo Nakano; Seika Nakamura; Kiyomi Shimohashi, all of Osaka, Japan

[73] Assignee: Sumitomo Electric Industries, Ltd., Osaka, Japan

[21] Appl. No.: 52,373

[22] Filed: May 21, 1987

[30] Foreign Application Priority Data

May 23, 1986 [JP] Japan ............................ 61-78498[U]

[51] Int. Cl.⁴ .......................................... G01R 19/145
[52] U.S. Cl. ...................................... 361/93; 361/107; 324/127
[58] Field of Search ...................... 174/40 R; 307/147; 324/127, 126; 336/174, 175; 361/42, 62, 63, 64, 66, 93, 107; 191/27; 340/664

[56] References Cited

U.S. PATENT DOCUMENTS

| | | | |
|---|---|---|---|
| 3,185,424 | 5/1965 | Sloop | 248/205.1 |
| 3,259,762 | 7/1966 | Skuderna | 361/107 |
| 4,268,818 | 5/1981 | Davis et al. | 174/146 X |
| 4,558,311 | 12/1985 | McAllise | 340/680 |
| 4,593,276 | 6/1986 | Aida et al. | 340/664 |
| 4,635,055 | 1/1987 | Fernandes et al. | 324/127 |
| 4,675,773 | 6/1987 | Shirakawa et al. | 361/63 |

FOREIGN PATENT DOCUMENTS

| | | |
|---|---|---|
| 0002387 | 6/1979 | European Pat. Off. . |
| 0125050 | 11/1984 | European Pat. Off. . |
| 1937378 | 4/1966 | Fed. Rep. of Germany . |
| 2130239 | 11/1972 | France . |
| 2277454 | 1/1976 | France . |
| 737856 | 2/1977 | U.S.S.R. ............................ 324/127 |
| 2167605 | 5/1986 | United Kingdom . |

OTHER PUBLICATIONS

Patent Abstracts of Japan, vol. 7, No. 96 (P-193) 1241, 22nd Apr. 1983; & JP-A-58 21 173 (Sumitomo Kinzoku Iogyo KK), 7/2/83, Abstract.

Primary Examiner—A. D. Pellinen
Assistant Examiner—H. L. Williams
Attorney, Agent, or Firm—Cushman, Darby & Cushman

[57] ABSTRACT

In a overhead power transmission system, a sensing member for detecting condition of the overhead power transmission or distribution lines or the ground wire is secured to an anchor and clamp member for anchoring and clamping the power line or overhead ground wire so as to prevent undesired movement of the sensing member.

10 Claims, 3 Drawing Sheets

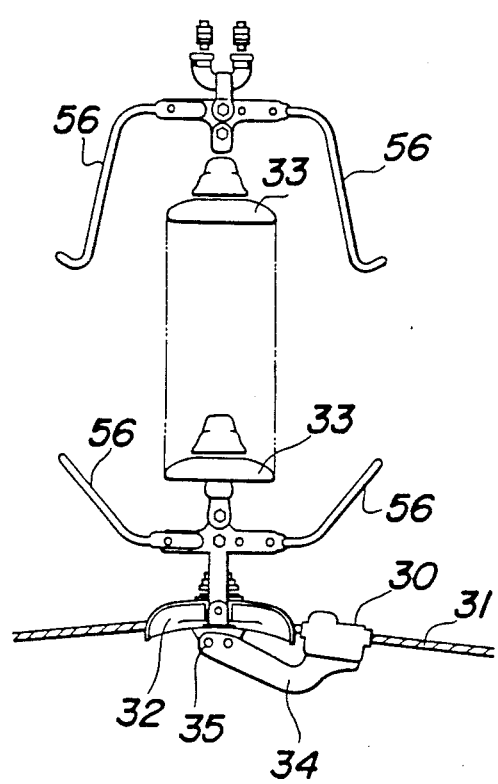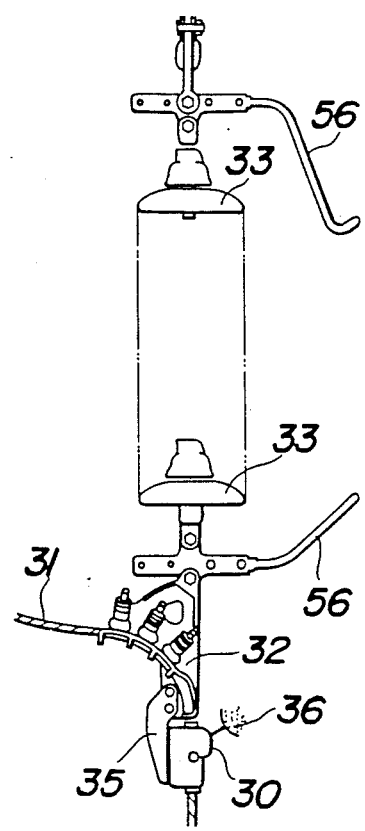

MONITORING DEVICE FOR OVERHEAD POWER TRANSMISSION SYSTEM

BACKGROUND OF THE INVENTION

1. Field of the Invention

The present invention relates to a monitoring device for overhead electric power transmission system or power distribution system and more particularly to a monitoring device for monitoring condition of the power transmission system or power distribution system such as an abnormal current flowing in overhead power transmission lines and/or an overhead ground wire when accident or lightning stroke occur, wire vibration or wire temperature and so on.

2. Background of the Invention

In a conventional monitoring device of the type mentioned above, a current detecting unit such as a current transformer is directly mounted to an overhead ground line which is suspended by means of anchor and clamp members coupled to arms of steel towers of an overhead power transmission system. In such case, the current transformer is mounted to the overhead ground wire by passing the overhead ground wire through the center hole of the current transformer, and the current transformer is fastened to the overhead ground wire only by the friction between the overhead ground wire and the current transformer.

In the conventional arrangement as mentioned above, the clamping force of the current transformer to the overhead ground wire is gradually weakened due to the vibration of the ground wire and the secular variation, whereby the current transformer may be moved along the ground wire, resulting in damage of the ground wire. Therefore, in the conventional arrangement, it is difficult to guarantee the ability of detection of the conventional monitoring device for a long time and reliability of the monitoring device is relatively low.

SUMMARY OF THE INVENTION

An essential object of the present invention is to provide a monitoring device which can assure to detect condition of the overhead power transmission system or power distribution system for a long time without the secular change.

According to the present invention, there is provided a monitoring device for an overhead power transmission system comprising power transmission or distribution line or an overhead ground wire suspended along a plurality of steel towers of overhead power transmission or power distribution system, anchoring means for anchoring said power transmission or distribution line or overhead ground wire at each of said steel towers and sensing means for sensing condition of the overhead power transmission or power distribution system, characterized in that said sensing means is so disposed as to allow said overhead ground wire or power transmission or distribution line to pass through or disposed adjacent thereto and is secured to said anchoring means.

The sensing means may be a current transformer for detecting abnormal current occurring in said power transmission or distribution line in said overhead ground wire in case of accident of the power transmission system or lightening stroke.

The sensing means may be a sensor for detecting condition such as vibration of the power transmission or distribution line or overhead ground wire due to wind.

Moreover, the sensing means may be a sensor for detecting a layer of snow deposited on the overhead power transmission or distribution line or overhead ground wire.

The current transformer may be secured to the bottom portion of the anchoring means.

The overhead ground wire may be a composite optical fiber overhead ground wire.

According to the present invention, there is further provided an assembly of anchoring device for use in an overhead power transmission system for anchoring an overhead ground wire which comprises an anchoring member having a clamp body for clamping said overhead ground wire at the intermediate area of the anchoring member and a first coupling end portion formed on one longitudinal end for coupling said anchoring member with an arm of a steel tower, second coupling end portion formed on another end portion opposite to said first coupling end and a sensing member secured to said second coupling end portion of the anchoring member.

BRIEF EXPLANATION OF THE DRAWINGS

FIG. 3 is a side elevation of another embodiment of a monitoring device according to the present invention, and FIG. 4 is a side elevation of a further embodiment of a monitoring device according to the present invention.

DETAILED DESCRIPTION OF THE PREFERRED EMBODIMENTS

Figure 1:
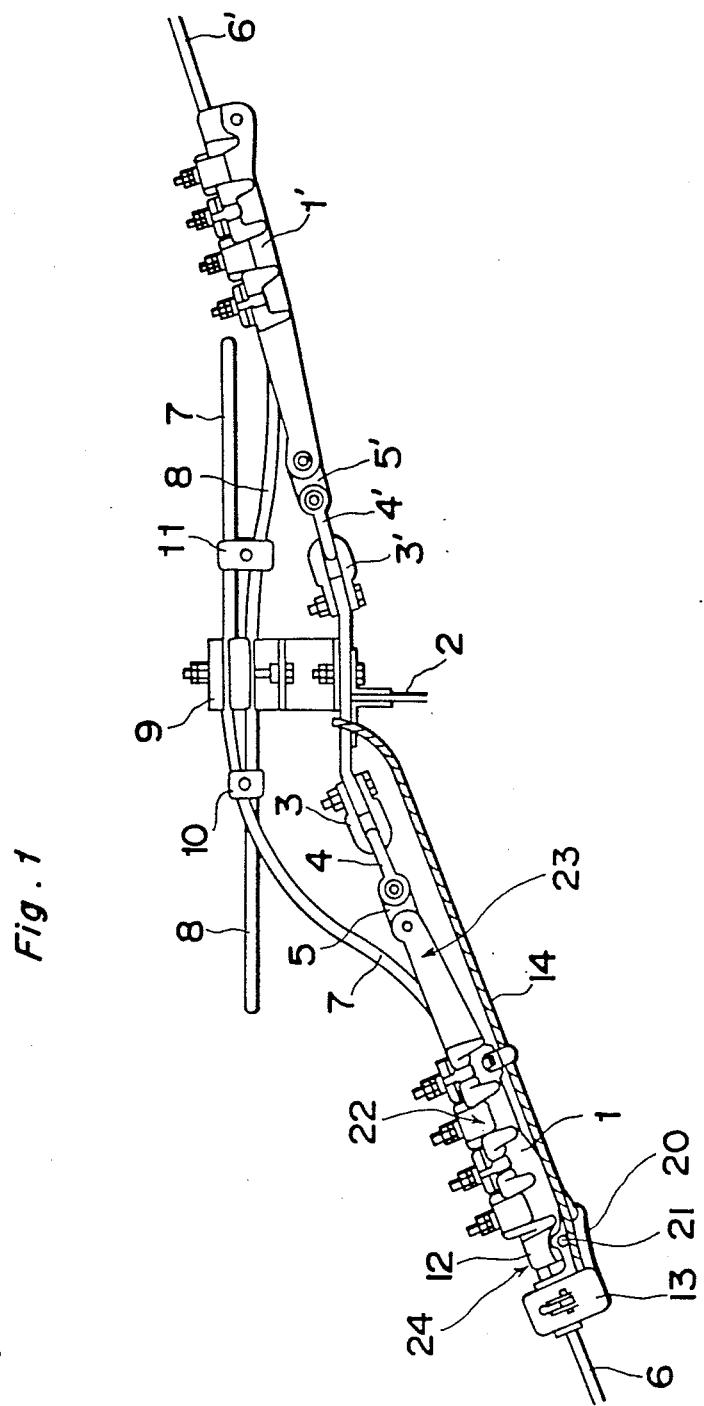
FIG. 1 is a side elevation of an embodiment of a monitoring device according to the present invention.
Figure 2:
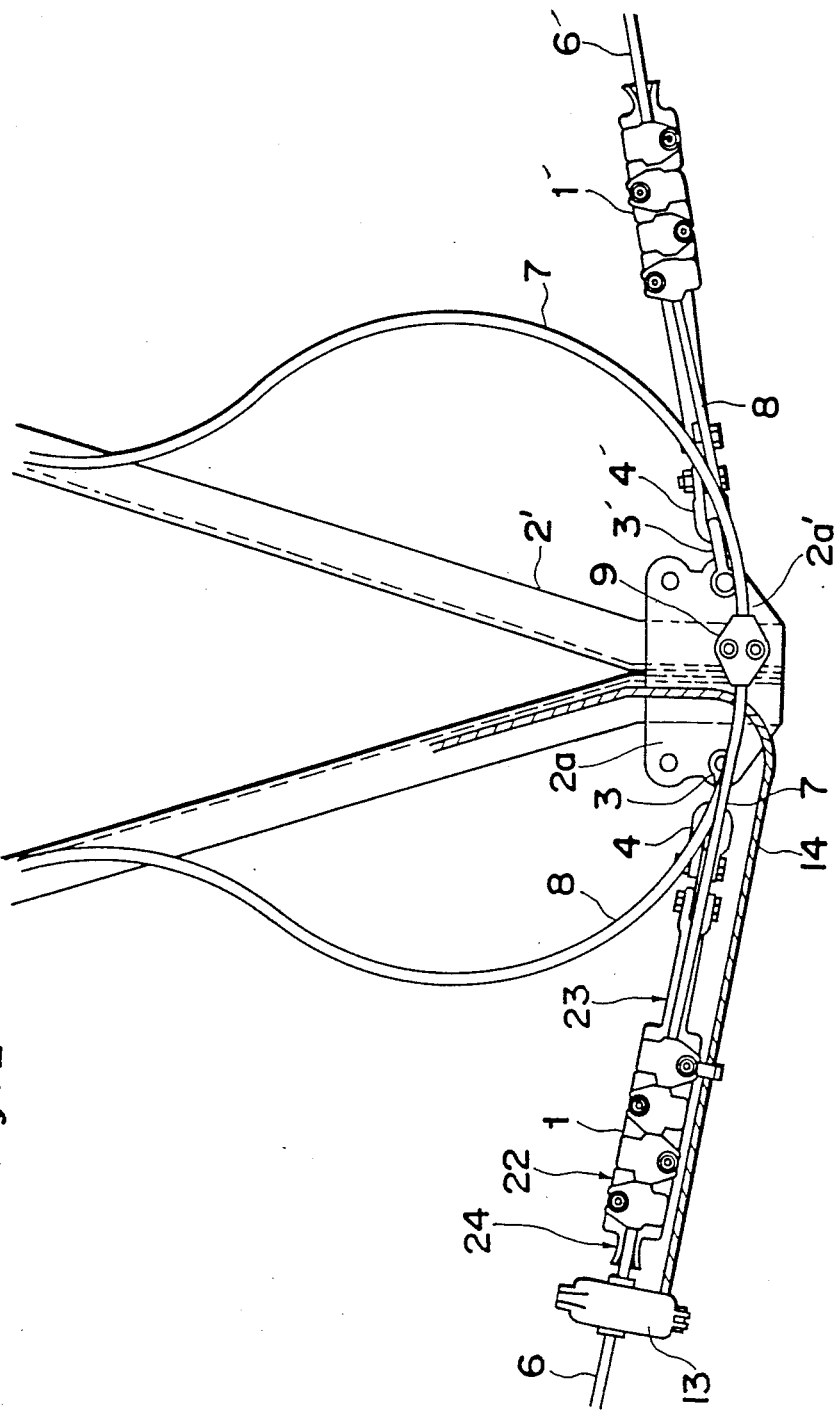
FIG. 2 is a top plan view of the monitoring device shown in FIG. 1.

Referring to FIGS. 1 and 2, there is shown an anchor and clamp member 1 coupled with end portion 2a of an arm 2 protruded horizontally from steel tower (not shown) of the overhead power transmission system through connecting members 3, 4 and 5 so as to clamp and anchor an optical fiber composite over head ground wire 6 (referred to as OPGW hereinafter). There is shown another anchor and clamp member 1' coupled with end portion 2a' of an arm 2' protruded horizontally from another steel tower (not shown) of the overhead power transmission system through connecting members 3', 4' and 5' so as to clamp and anchor another OPGW 6'. The respective OPGWs 6 are suspended across at least two adjacent steel towers in such a manner as mentioned above. Reference numerals 7 and 8 denote respectively jumper lines of the OPGWs 6 and 6' extending from the anchor and clamp members 1 and 1' toward joint boxes situated on the steel towers. Reference numeral 9 denotes a clamp member secured to the top portion of the arm 2 for clamping the respective jumper lines 7 and 8. Reference numerals 10 and 11 denote additional clamp members for clamping the respective jumper lines 7 and 8 at both sides of the clamp member 9.

In the embodiment shown, a sensor 13 is secured at the bottom portion of the conductor introducing end portion 12 of the anchor and clamp member 1 and the sensor 13 is so arranged as to pass the OPGW 6 or situated adjacent to the OPGW 6 at the position of the introductory part of the OPGW 6 to the anchor and clamp member 1 so that the sensor 13 can detect abnormal through the overhead ground wire. The sensor 13 is connected by means of lead wire 14 with a transmission terminal device through a joint box for connecting the optical fiber of the OPGW.

Although, in the embodiment shown, only the anchor and clamp member 1 is provided with the sensor 13, the anchor and clamp member 1' may also be provided with another sensor. It is essential in the present embodiment that at least one of the anchor and clamp members of the two anchor and clamp members 1 and 1' of a steel tower is provided with the sensor 13 which is secured to the anchor and clamp member.

The anchor and clamp member 1 has a clamp body for clamping said OPGW 6 at the intermediate area of the anchor and clamp member 1 and a first coupling end portion 23 formed on its one longitudinal end for coupling said anchor clamp member 1 with the arm 2 of the steel tower (not shown) and a second coupling end portion 24 (or conductor introductory portion 12) formed on another end portion opposite to said first coupling end portion 23. The sensor 13 is secured adjacent to the second coupling end portion 24 and away from the first coupling end portion 23.

The sensor 13 may be a current transformer in an annular shape having a center hole (not shown) to pass through the OPGW 6 and the current transformer 13 is secured to the second end portion 24 of the anchor and clamp member 1 through the securing bracket 20 projected from the current transformer 13 by means of a screw 21.

By the arrangement mentioned above, since the sensor or the current transformer 13 is secured to the anchor and clamp member 1 which clamps the OPGW 6, the sensor 13 is prevented from being displaced even if there is vibration of the OPGW 6, whereby the ability of the sensor of detecting the specific condition such as abnormal current flowing in the OPGW is not influenced by the vibration of the OPGW and secular change. Moreover, since the sensor can be assembled to the anchor and clamp member as one body, there occurs neither displacement of the sensor nor the problem of the fastening portion of the sensor to the ground wire regardless of the vibration of the OPGW. Accordingly, damage of the OPGW due to movement of the current transformer can be prevented. Also, it is assured to keep the stabilized detecting ability of the sensor for a long time, whereby it is possible to make the monitoring device of the overhead power transmission system with a high reliability.

The operation of the monitoring device will be explained hereinafter.

When an abnormal current flows in the OPGW 6 due to an accident in the power transmission lines or lightening stroke, the abnormal current is detected by the sensor 13 and the detecting signal is transferred to the transmission terminal device (not shown) and is compared with another detecting signal fed from a different sensor situated on a different steel tower. Accordingly, it can be detected that on what steel tower or span the accident occurs, whereby it is possible to take a necessary step in case there occurs necessity of detection of cut off of the power or detection of the accident.

FIG. 3 shows another embodiment of the present invention in which a current transformer 30 as the sensing member is mounted onto the power transmission line 31 clamped by a clamp member 32. The clamp member 32 is suspended by a suspension insulator 33 which is also suspended on a steel tower of the power transmission system. The current transformer 30 is secured to the clamp member 32 through a securing member 34 fastened to the bottom of the clamp member 32 by means of screws 35. The embodiment shown in FIG. 3 is used for the steel towers of the intermediate portion of the power transmission system.

FIG. 4 shows a further embodiment of the monitoring device according to the present invention which may be employed at the steel tower of an end terminal of the power transmission system for anchoring the power transmission line 31. In the embodiment shown in FIG. 4, the current transformer 30 as the sensing member is secured to the clamp member 32 through the securing member 34. The information of the abnormal current of the transmission line obtained by the current transformer 30 is transmitted from an antenna 36 mounted on the current transformer 30 to a terresterial station (not shown) in a wireless communication. In FIGS. 3 and 4, reference numeral 56 denotes arcing horns.

It is noted that the present invention may be employed not only in the power transmission system which transmits the electric power of relatively high voltage a long distance but also to the power distribution system which distributes the electric power of relatively low voltage relatively short distance.

Moreover, although the current transformer is used as the sensing member in the various embodiments mentioned above, there may be used other types of sensing member for detecting various kinds of conditions such as vibration detector to detect the vibration of the overhead power transmission or distribution phase lines or the overhead ground wire or a snow detector which detects the diameter of the snow deposited on the overhead power transmission or distribution lines or the overhead ground wire or a temperature detector for detecting the temperature of the overhead power transmission or distribution lines or overhead ground wire. In this case the sensing member may be disposed adjacent to the overhead power transmission or distribution lines or the overhead ground wire.

What is claimed is:

1. A monitoring device for an overhead power transmission system or power distribution system for use with a main overhead power transmission line or a main overhead ground wire suspended along a plurality of steel towers of an overhead power transmission system or power distribution system, comprising: anchoring means secured to the main overhead power transmission line or main ground wire for anchoring said overhead power transmission line or overhead ground wire at each of said steel towers, and sensing means for sensing a condition of the overhead power transmission system or power distribution system characterized in that said sensing means is so disposed as to allow said overhead power transmission line or overhead ground wire to pass through or disposed adjacent thereto and is secured to said anchoring means.

2. The monitoring device according to claim 1, wherein said sensing means is a current transformer for detecting abnormal current of the power transmission system or the power distribution system or flowing through said overhead ground wire in case of accident of the power transmission system or power distribution system or lightning stroke.

3. The monitoring device according to claim 2, wherein the anchoring means has a first coupling end portion and a second coupling end portion; and said current transformer is secured adjacent to the second coupling end portion.

4. The monitoring device according to claim 1, wherein said overhead ground wire is a composite optical fiber overhead ground wire.

5. The monitoring device according to claim 1 wherein said sensing means is a detector for detecting vibration of the overhead power transmission line or overhead ground wire.

6. The monitoring device according to claim 1 wherein said sensing means is a detector for detecting temperature of the overhead power transmission line or overhead ground wire.

7. The monitoring device according to claim 1 wherein said sensing means is a detector for detecting a layer of snow deposited on the overhead power transmission line or overhead ground wire.

8. An assembly of anchoring device for use in a main overhead power transmission or distribution system for anchoring a main overhead ground wire which comprises an anchoring member having a clamp body for clamping said overhead ground wire at the intermediate area of the anchoring member; a first coupling end portion formed on one longitudinal end for coupling said anchoring member with an arm of a steel tower, and a second coupling end portion formed on another end portion opposite to said first coupling end for coupling said anchoring member with the main ground wire and a sensing member secured to said second coupling end portion of the anchoring member.

9. The assembly according to claim 8, wherein said sensing member is a current transformer of an annular shape with a center hole to pass the overhead ground wire and a securing bracket for securing said current transformer on the anchoring member.

10. The assembly according to claim 9, wherein said current transformer is secured adjacent to the second coupling end portion of said anchoring member through said bracket.

* * * * *